(12) United States Patent
Hutin et al.

(10) Patent No.: US 10,903,349 B2
(45) Date of Patent: Jan. 26, 2021

(54) ELECTRONIC COMPONENT WITH MULTIPLE QUANTUM ISLANDS

(71) Applicant: Commissariat A L'Energie Atomique et aux Energies Alternatives, Paris (FR)

(72) Inventors: Louis Hutin, Grenoble (FR); Sylvain Barraud, Grenoble (FR); Benoit Bertrand, Grenoble (FR); Maud Vinet, Grenoble (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 16/413,646

(22) Filed: May 16, 2019

(65) Prior Publication Data
US 2019/0371926 A1 Dec. 5, 2019

(30) Foreign Application Priority Data
May 17, 2018 (FR) ...................... 18 54110

(51) Int. Cl.
*H01L 29/06* (2006.01)
*H01L 29/775* (2006.01)
(Continued)

(52) U.S. Cl.
CPC ........ *H01L 29/775* (2013.01); *H01L 29/0673* (2013.01); *H01L 29/42384* (2013.01); *H01L 29/66439* (2013.01)

(58) Field of Classification Search
CPC ............... H01L 29/775; H01L 29/0673; H01L 29/42384; H01L 29/66433; H01L 29/66439
See application file for complete search history.

(56) References Cited

U.S. PATENT DOCUMENTS

2010/0273317 A1* 10/2010 Ernst ................. H01L 21/02532
438/479
2011/0272673 A1* 11/2011 Bangsaruntip .......... H01L 21/84
257/24
(Continued)

FOREIGN PATENT DOCUMENTS

WO WO 2014/146162 A1 9/2014
WO WO 2015/184484 A1 12/2015
(Continued)

OTHER PUBLICATIONS

French Preliminary Search Report dated Mar. 12, 2019 in French Application 18 54109, filed on May 17, 2018 (with English Translation of categories of Cited Documents & Written Opinion).
(Continued)

*Primary Examiner* — Phuc T Dang
(74) *Attorney, Agent, or Firm* — Oblon, McClelland, Maier & Neustadt, L.L.P.

(57) ABSTRACT

An electronic component with multiple quantum islands is provided, including a substrate on which rests a nanowire made of semiconductor material not intentionally doped; two main control gates resting on the nanowire so as to form respective qubits in the nanowire, the two main control gates being separated by a groove, and bottom and lateral faces of the groove are covered by a dielectric layer; an element made of conductive material formed on the dielectric layer in the groove; a carrier reservoir that is offset with respect to the nanowire, the element made of the conductive material being separated from the carrier reservoir by another dielectric layer such that the element made of the conductive material is coupled to the carrier reservoir by field effect. A method of fabricating an electronic component with multiple quantum islands is also provided.

22 Claims, 19 Drawing Sheets

(51) Int. Cl.
*H01L 29/423* (2006.01)
*H01L 29/66* (2006.01)

(56) References Cited

U.S. PATENT DOCUMENTS

| | | |
|---|---|---|
| 2013/0221330 A1 | 8/2013 | Choi et al. |
| 2015/0279981 A1 | 10/2015 | Eriksson et al. |
| 2016/0275410 A1 | 9/2016 | Rogge et al. |
| 2016/0300155 A1 | 10/2016 | Betz et al. |
| 2017/0147939 A1 | 5/2017 | Dzurak et al. |
| 2020/0006478 A1* | 1/2020 | Hsu ............... H01L 29/0673 |
| 2020/0091287 A1* | 3/2020 | Glass ............ H01L 29/66439 |

FOREIGN PATENT DOCUMENTS

| | | |
|---|---|---|
| WO | WO 2017/210790 A1 | 12/2017 |
| WO | WO 2017/213637 A1 | 12/2017 |

OTHER PUBLICATIONS

French Preliminary Search Report dated Apr. 5, 2019 in French Application 18 54110, filed on May 17, 2018 (with English Translation of categories of Cited Documents & Written Opinion).
De Franceschi, S. et al. "SOI technology for quantum information processing", 2016 IEEE International Electron Devices Meeting (IEDM), 2016, 4 pages.
Rotta, D. et al. "Maximum density of quantum information in a scalable CMOS implementation of the hybrid qubit architecture", Quantum Information Processing, vol. 15, No. 6, 2016, 22 pages.

* cited by examiner

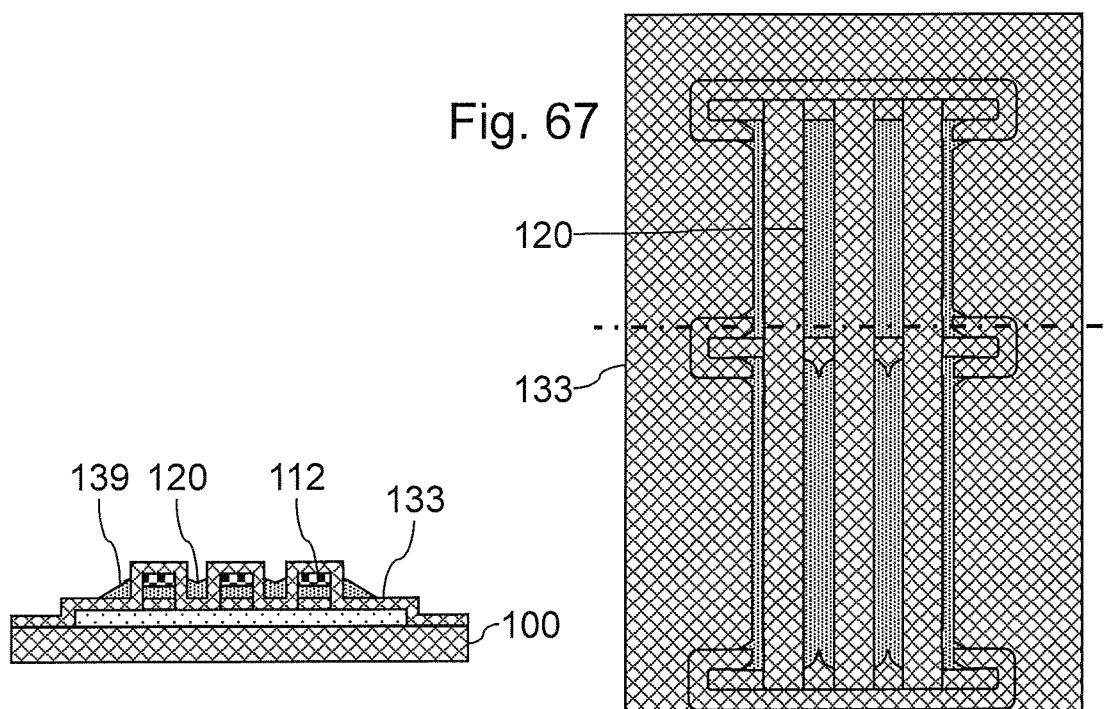
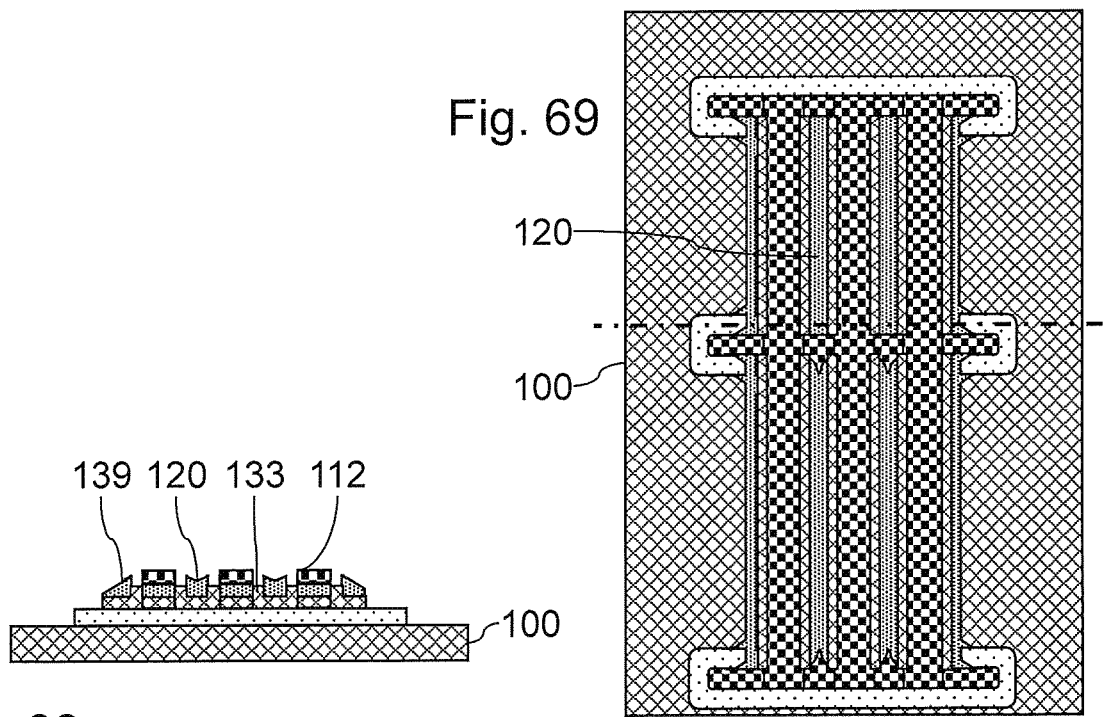

ELECTRONIC COMPONENT WITH MULTIPLE QUANTUM ISLANDS

The invention relates to the field of spintronics, and notably to electronic components with multiple quantum dots, islands or bits coupled together, together with the fabrication methods thereof.

Quantum electronics provides a basis for improvements in performance. By analogy with conventional electronics, the quantum bit represents the basic element of the calculation for quantum electronics. In conventional electronics, Boolean calculations are carried out based on bits having a certain state from between two possible states. A quantum bit is a superposition of the eigen states 10> and 11>.

Quantum islands (also known as quantum dots, spin qubits or quantum bits) are used as basic elements in quantum electronics. The quantum islands use nanostructures of semiconductors to form potential wells for confining electrons or holes in the three dimensions of space. The quantum information is then coded in purely quantum degrees of freedom: currently the spin ½ of the electron. The aim of quantum dots is to trap an isolated electron so as to store a qubit. The quantum dots then make it possible to use decoupled calculation capacitances with respect to a system using binary logic. According to one approach, electrons are confined by field effect under gates of transistors, and the information is encoded in the spin of these electrons.

In order to perform quantum logic operations, it is important to be able to:
manipulate the quantum state of the qubits;
detect a change in the quantum states of the qubits;
make the qubits communicate with one another via an adjustable or modulatable quantum coupling.

In order to make adjacent qubits communicate with an adjustable coupling mechanism, a known solution is to adjust the Coulomb potential barrier between these adjacent qubits.

According to some designs, the control of a qubit is provided via a primary or main gate positioned directly above the qubit, the modulation of the potential barrier being provided by a secondary gate positioned directly above the gap between two adjacent qubits.

In order to ensure a coupling between adjacent qubits, it may turn out to be important for these qubits to be very close together (typically of the order of 50 nm), which may impose a pitch of less than 100 nm between the primary gates of these qubits.

The placing of a secondary gate between these primary gates may then prove to be problematic from an industrial point of view, the formation of the secondary gates necessitating an etching precision that is difficult to attain.

The idea in the document "A two-qubit logic gate in silicon" by M. Veldhorst et al., Nature 526, 410-414 (2015), is to control the coupling between two qubits by disposing secondary gates between the primary gates of the qubits. A dielectric layer is firstly formed on the primary gates. The secondary gates spill over laterally onto the dielectric layer of these primary gates and are therefore partially superposed onto the adjacent primary gates. The dielectric layer provides the electrical isolation between the control gates and these additional gates.

This configuration allows a method of fabrication to be implemented with reduced dimensional control constraints and with a certain tolerance to the misalignment between the primary gates and the secondary gates.

This configuration however leads to a strong capacitive coupling between the primary and secondary gates which alters the operation of the component at high frequency. The corresponding method of fabrication furthermore always leads to significant dimensional control constraints and to significant constraints on tolerance to the misalignment.

In such a design, a certain number of qubits are aligned in series between two electrodes disposed at two ends of a nanowire, and used as carrier reservoirs. Such carrier reservoirs are far away from the middle qubits. The time for charging a middle qubit by an elementary charge may turn out to be relatively long.

The invention aims to solve one or more of these drawbacks. The invention thus relates to an electronic component with multiple quantum islands, such as defined in the appended claims.

Other features and advantages of the invention will become more clearly apparent from the description of it presented hereinafter, by way of non-limiting example, with reference to the appended drawings, in which:

FIGS. 39 to 82 illustrate cross-sectional and top views of a component with qubits at various steps of one embodiment of a method of fabrication according to another aspect of the invention;

Figure 81:
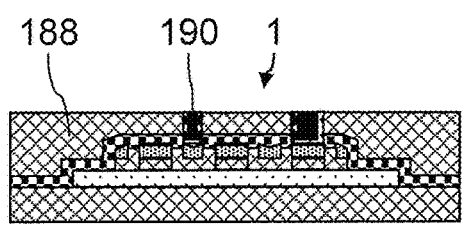

FIGS. 1 to 38 illustrate cross-sectional and top views of a component with qubits at various steps of one embodiment of a method of fabrication according to the invention. FIG. 81 is a diagram showing the steps implemented in this method. The description of the steps 901 to 908 is provided by way of illustration but these steps are known per se to those skilled in the art and may be carried out differently.

Figure 1:
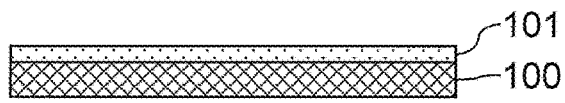
FIGS. 1 to 38 illustrate cross-sectional and top views of a component with qubits at various steps of one embodiment of a method of fabrication according to the invention.
Figure 2:
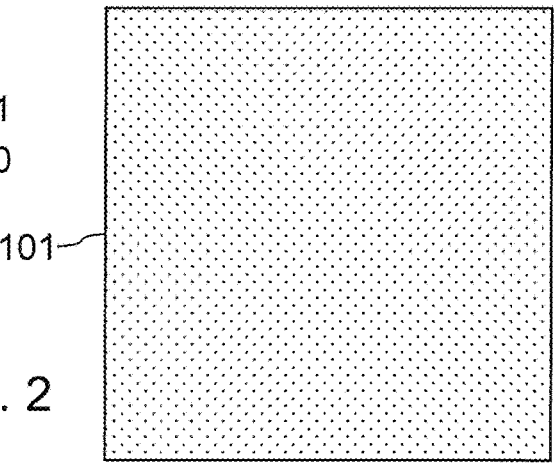

In FIGS. 1 and 2, the step 901 is implemented. In an initial step, a substrate of the silicon-on-insulator type is provided. A layer of silicon 101 (for example silicon not intentionally doped) is thus disposed on a layer of dielectric insulator 100, typically of $SiO_2$. The invention may of course also be applied to a bulk substrate or to a substrate having a shallow trench isolation insulator.

Figure 3:
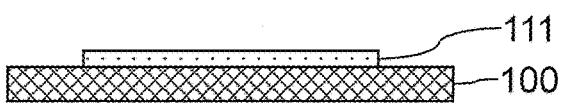
Figure 4:
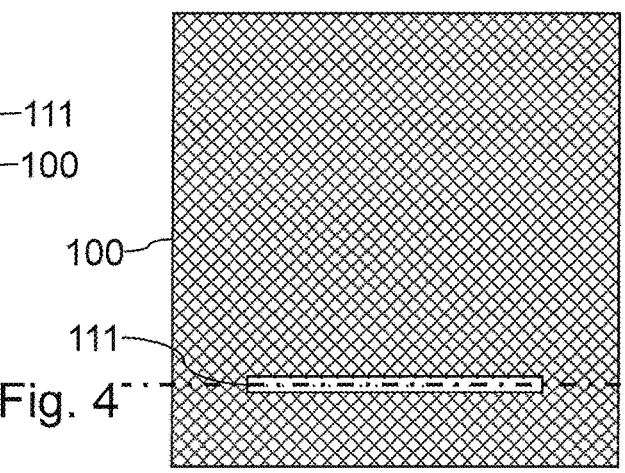

At the step 902, an etch of the layer of silicon 101 is implemented in order to form a nanowire 111, as illustrated in FIGS. 3 and 4. The etch is for example of the mesa type. The nanowire 111 typically has a height of less than or equal to three times its width. The width of the nanowire 111 is for example in the range between 60 and 80 nm.

Figure 5:
Figure 6:
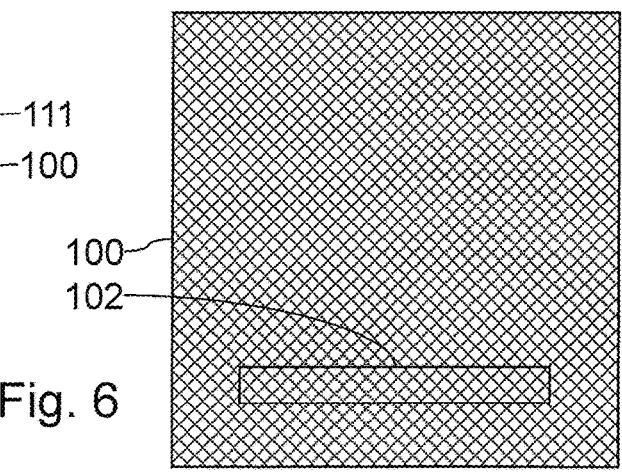

At the step 903, a dielectric layer 102 is formed for encapsulating the nanowire 111, as illustrated in FIGS. 5 and 6. The dielectric layer 102 may for example be formed by thermal oxidation of the surface of the nanowire 111 or by deposition of a dielectric layer.

Figure 7:
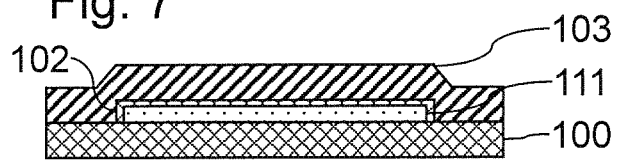
Figure 8:
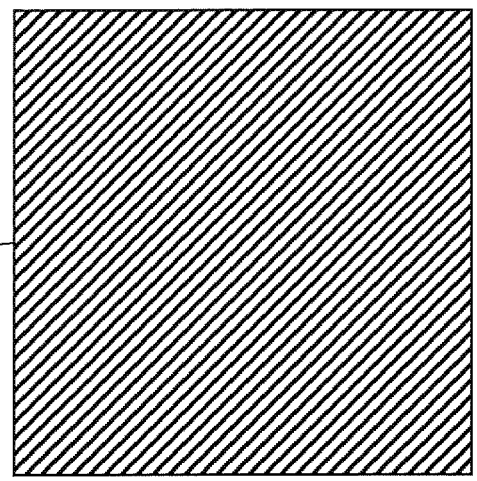

At the step 904, a full-sheet gate conductor layer 103 is formed, as illustrated in FIGS. 7 and 8. The layer 103 may for example be of highly-doped polysilicon, of metal, or may include a stack of polysilicon, of gate metal and of dielectric.

Figure 9:
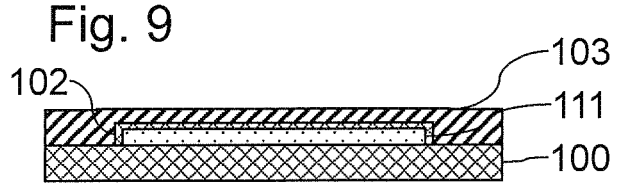
Figure 10:
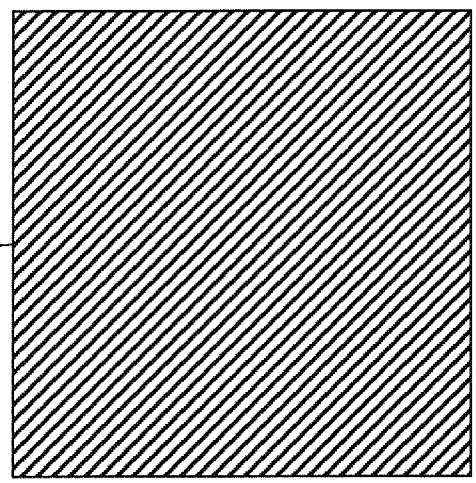

At the step 905, a planarization step is advantageously implemented, as illustrated in FIGS. 9 and 10. This planarization may for example be implemented by chemical-mechanical polishing.

Figure 11:
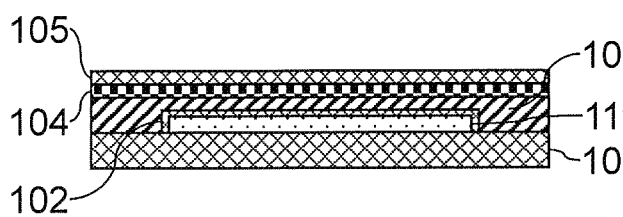
Figure 12:
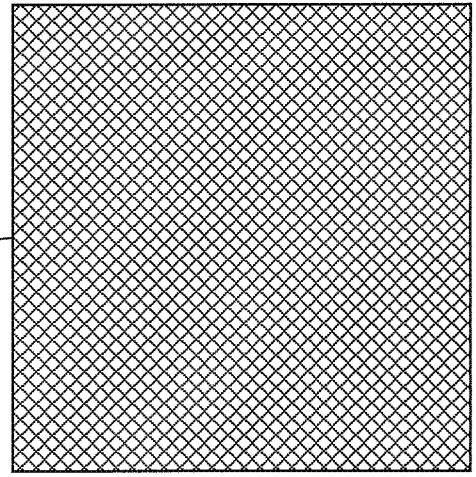

At the step 906, a step for formation of a hard mask is implemented, as illustrated in FIGS. 11 and 12. The hard mask here advantageously comprises a superposition of a layer of nitride 104 and of a layer of SiO$_2$ 105. The hard mask is dimensioned so as to be able to withstand an etch such as that defined at the step 907.

Figure 13:
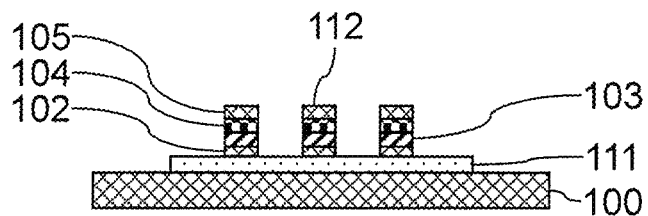
Figure 14:
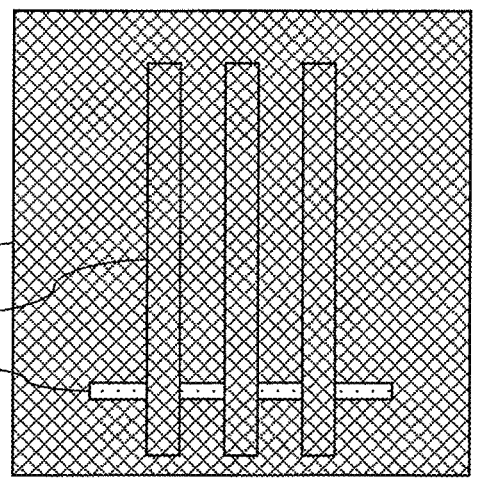

At the step 907, an etch step is implemented so as to define the shape of the main gates 112, as illustrated in FIGS. 13 and 14. The main gates 112 are for example defined with an etch pitch of 90 nm, for example by an immersion method using deep ultraviolet photolithography. The etch is for example of the anisotropic type. Grooves are formed between the main gates 112, in particular directly above the nanowire 111. The grooves typically have a width in the range between 40 and 60 nm with a layer 101 of silicon, or a width in the range between 50 and 100 nm with a layer 101 of GaAs.

Figure 15:
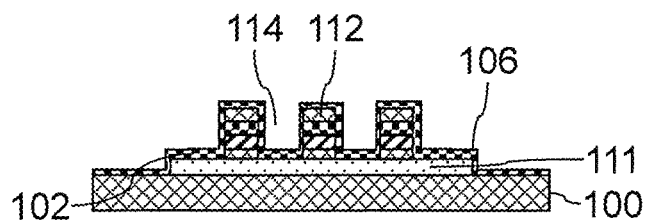
Figure 16:
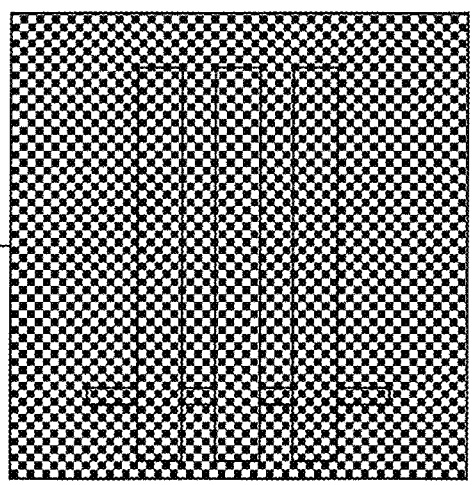

At the step 908, a dielectric layer 106 is formed, typically full sheet, for encapsulating the main gates 112 and the nanowire 111, as illustrated in FIGS. 15 and 16. The dielectric layer 106 may for example include a layer of silicon nitride for a stopping function during a later etch. The dielectric layer 106 may also comprise a lower layer of silicon oxide in order to enhance the quality of the interface. The layer 106 is designed to form a separation between the main gates 112 and secondary gates that are detailed hereinbelow. The layer 106 is formed so as to conserve grooves 114 between successive main gates 112. The layer 106 typically has a thickness in the range between 5 and 15 nm.

Figure 17:
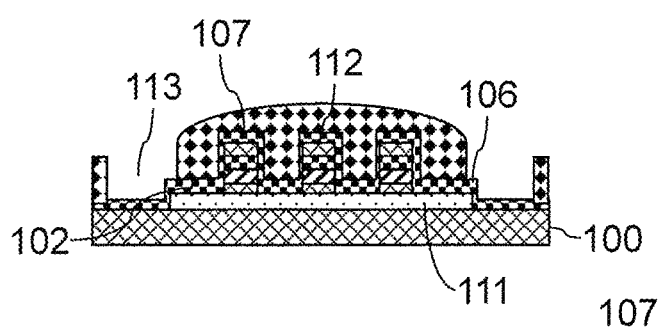
Figure 18:
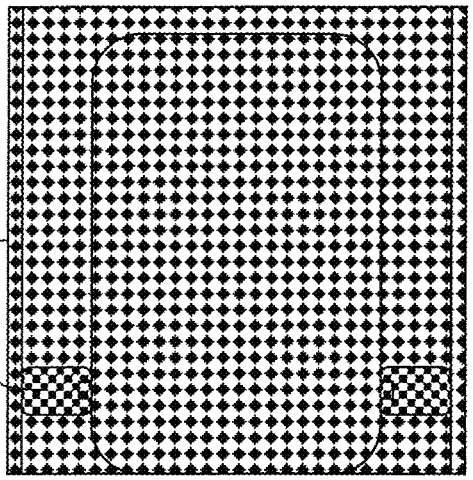

At the step 909, according to one variant of the fabrication method, a step for formation of a mask 107 is implemented defining openings 113 for the formation of the carrier reservoirs, as illustrated in FIGS. 17 and 18. The layer 106 is uncovered on either side of the ends of the nanowire 111.

Figure 19:
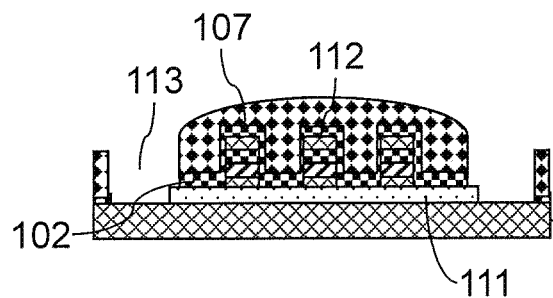
Figure 20:
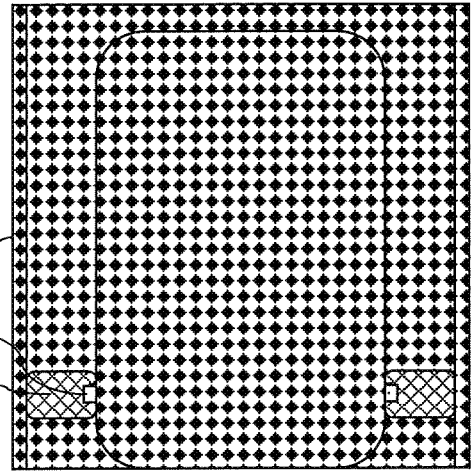

At the step 910, the dielectric layer 106 is removed on the bottom of the openings 113, as illustrated in FIGS. 19 and 20, in order to be able to carry out a deposition by epitaxy of carrier reservoirs according to one variant of the method of fabrication. This removal may for example be implemented by a suitable anisotropic etch.

Figure 21:
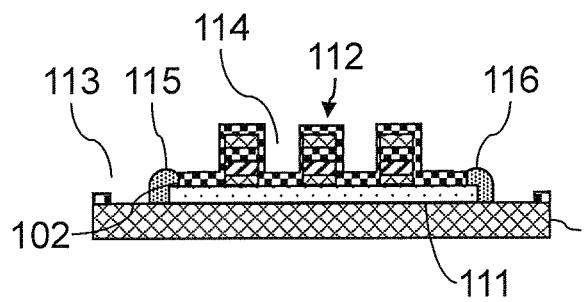
Figure 22:
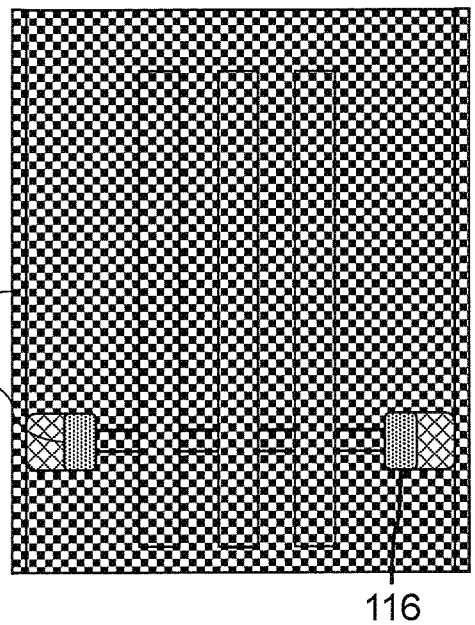

At the step 911, carrier reservoir regions 115 and 116 are formed on either side of the nanowire 111, as illustrated in FIGS. 21 and 22. The carrier reservoirs 115 and 116 are formed here by selective epitaxy of a doped semiconductor material, starting from the ends of the nanowire 111. The mask 107 is removed so as to uncover the residual part of the dielectric layer 106.

According to another embodiment, it may also be envisaged to perform a doping by ion implantation in the openings 113, following the step 909, in order to form carrier reservoirs at the ends of the nanowire 111.

Figure 23:
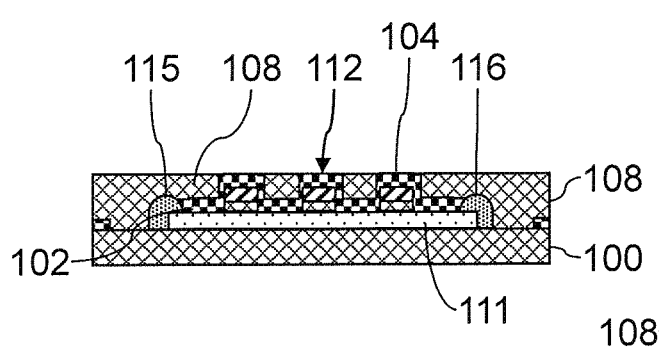
Figure 24:
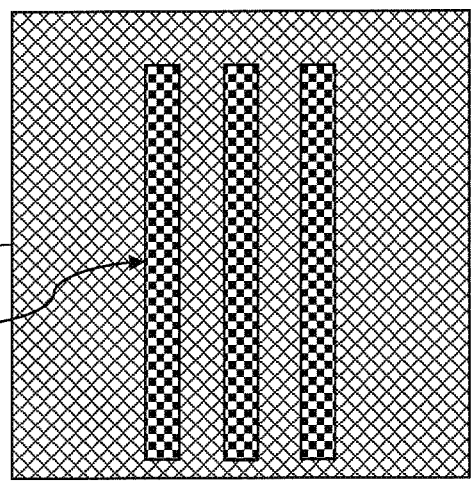

At the step 912, an encapsulation is carried out by deposition of a dielectric layer 108. Here, a chemical-mechanical polishing is furthermore carried out with a stop on the layer 106 on top of the main gates 112, or with a stop on the layer 104, as illustrated in FIGS. 23 and 24. The grooves between the main gates 112 are filled with the dielectric 108.

Because of the prior planarization step, a chemical-mechanical polishing step with a stop on the top of the main gates 112 is facilitated.

Figure 25:
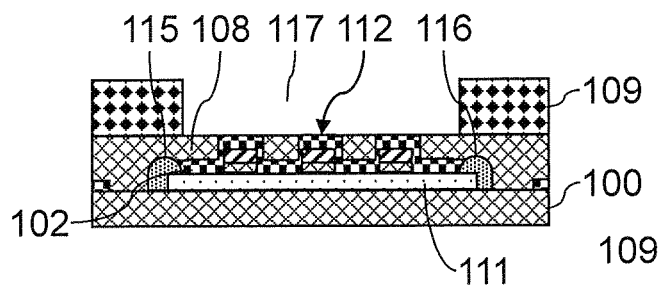
Figure 26:
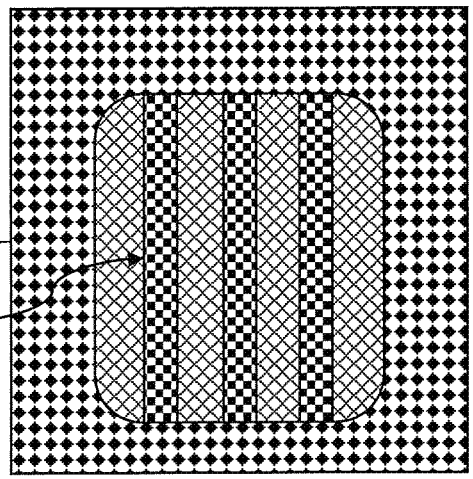

At the step 913, a step for formation of a mask 109 is implemented, defining an opening 117 for the formation of self-aligned secondary gates, as illustrated in FIGS. 25 and 26. The opening 117 forms an access to the main gates and to the layer 108 up to the edges of the carrier reservoirs 115 and 116. The layer 109 covers the vertical part of the carrier reservoirs 115 and 116. The opening 117 may be aligned on the longitudinal ends of the main gates 112. The opening 117 may however also define an offset with the ends of the main gates 112, in such a manner that these ends are covered by the layer 109.

Figure 27:
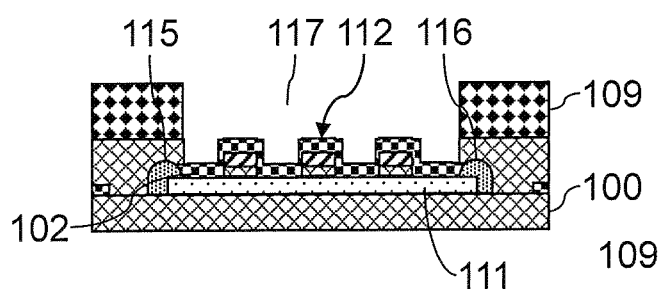
Figure 28:
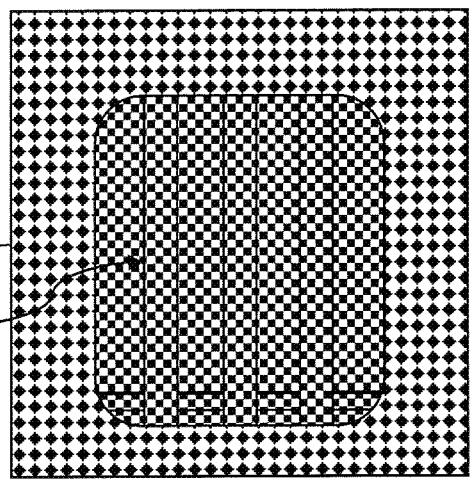

At the step 914, a step for removal of the dielectric 108 is implemented following the pattern of the opening 117, as illustrated in FIGS. 27 and 28.

Figure 29:
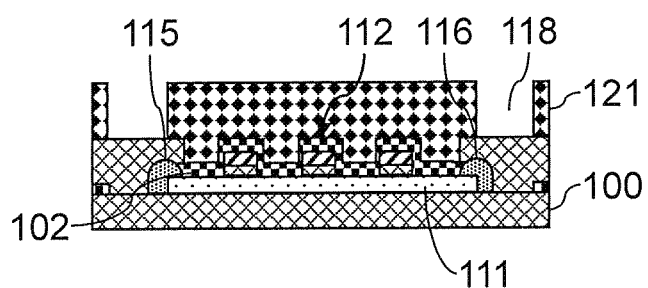
Figure 30:
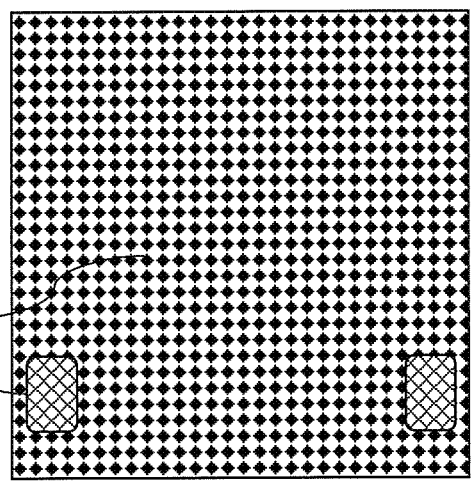

At the step 915, a step for formation of a mask 121 is implemented defining openings 118, as illustrated in FIGS. 29 and 30, for the formation of contacts for access to the carrier reservoirs 115 and 116. The openings 118 are formed in order to uncover the layer 108 directly above the carrier reservoirs 115 and 116. Depending on the resistance of the dielectric layer 108, the formation of the openings 118 may be carried out simultaneously with the step 913.

Figure 31:
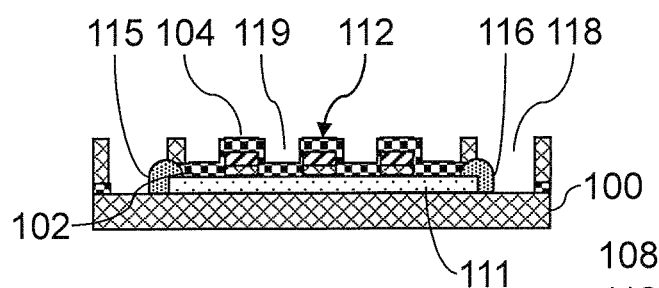
Figure 32:
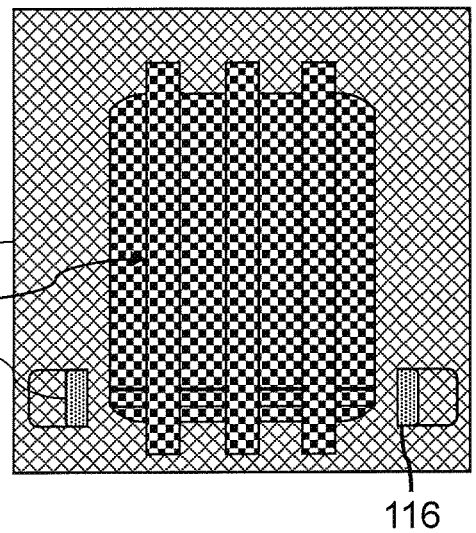

At the step 916, a step for anisotropic etching of the layer 108 is implemented in the openings 118, so as to uncover a part of the carrier reservoirs 115 and 116. As illustrated in FIGS. 31 and 32, the mask 121 is subsequently removed. Grooves 119 are cleared between the successive main gates 112.

Figure 33:
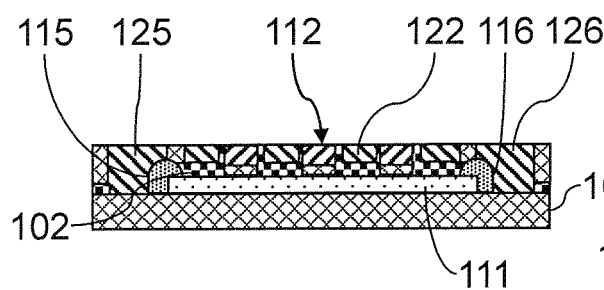
Figure 34:
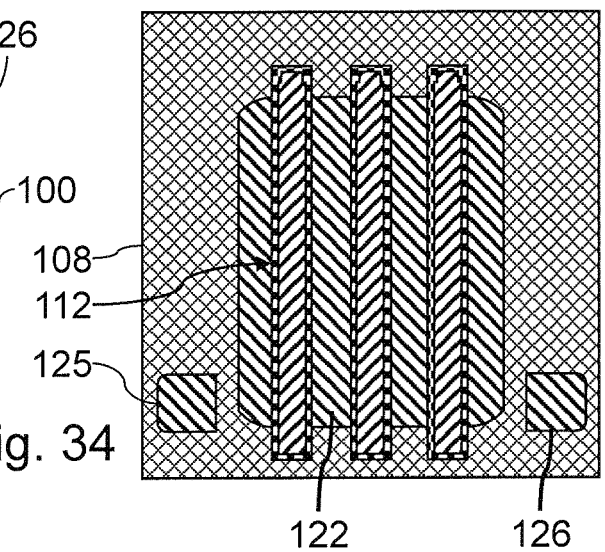

At the step 917, a metallization step is implemented, so as to fill in the openings 118 and the grooves 119. A mechanical polishing step is subsequently implemented. A contact 125 for the charge reservoir 115, a contact 126 for the charge reservoir 116 and for the secondary gates 122 (also denoted by the term JGates in the literature) are thus formed between the main gates 112, as illustrated in FIGS. 33 and 34. The secondary gates 122 extend directly above a coupling region of the nanowire 111. The main gates 112 are isolated from the secondary gates 122 by the dielectric layer 102. Main gates 112 and secondary gates 122 are thus obtained extending across the nanowire 111. The secondary gates 122 may thus be formed with a reduced capacitive coupling with the main gates 112, owing to the absence of superposition of the secondary gates 122 onto these main gates 112. Furthermore, such secondary gates 122 may be formed without leading to any increase in the etch pitch of the main gates 112, the secondary gates 122 here being self-aligned with the main gates 112.

In the example illustrated, the mechanical polishing step is carried out with a stop on the layer 103 of the main gates 112. It may also be envisaged to perform a mechanical polishing step with a stop on the layer 108 present on the main gates 112.

Figure 35:
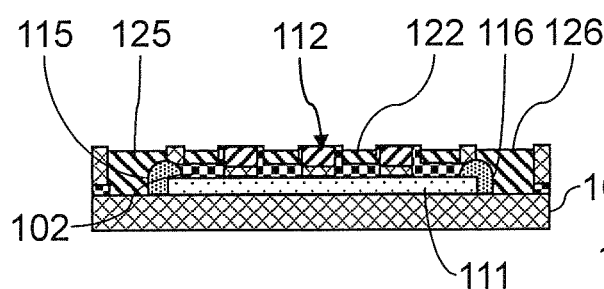
Figure 36:
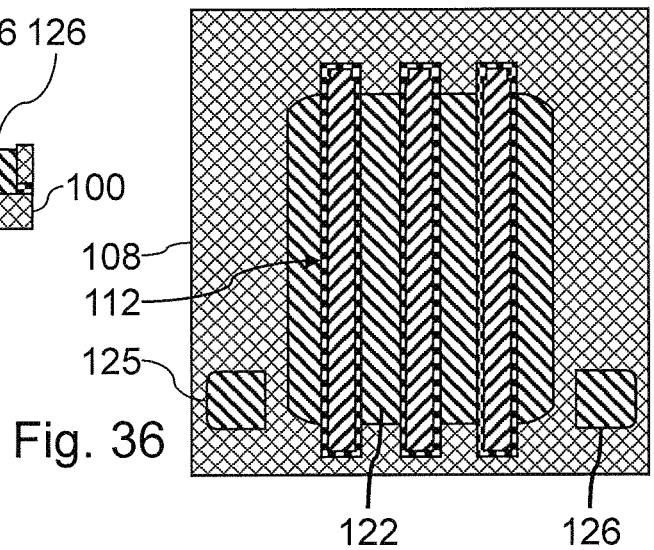

At the step 918, a step for partial removal of the metal from the secondary gates 122 is advantageously implemented, as illustrated in FIGS. 35 and 36. Such a removal step may for example be implemented by a selective partial etch. Such a selective partial etch is implemented either because of different materials for the secondary gates 122 and the layer 103, or for maintaining the layer 108 on top of the main gates 112.

By thus reducing the height of the secondary gates 122 with respect to the main gates 112, the capacitive coupling between the secondary gates 122 and the main gates 112 may be reduced.

Figure 37:
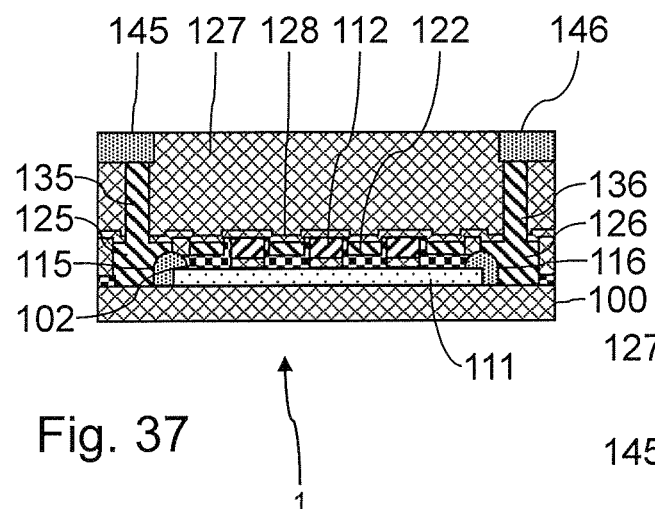
Figure 38:
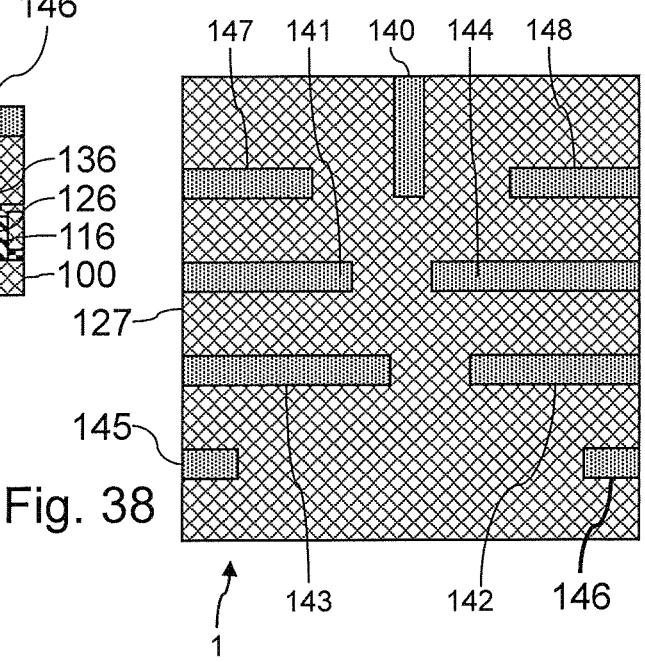

At the step 919, are advantageously implemented successive steps for:
  formation of a dielectric passivation layer 128, typically full sheet. The layer 128 is for example of SiN;
  formation of a dielectric encapsulation layer 127, typically full sheet. The dielectric layer 127 is for example of SiO$_2$;
  etch and metallization, with a view to forming vias until they make contact respectively with the contacts 125 and 126, the main gates 112 and the secondary gates 122. In particular, vias 135 and 136 are formed until they make contact respectively with the contacts 125 and 126 of the carrier reservoirs 115 and 116, as illustrated in FIGS. 37 and 38;

formation of interconnect tracks 140 to 148 in contact with respective vias.

Interconnect tracks 145 and 146 are respectively in contact with the vias 135 and 136. The interconnect tracks 143, 144, 147, and 148 are in contact with vias connected to secondary control gates 122. The interconnect tracks 140 to 142 are in contact with vias connected to main control gates 112.

The configuration illustrated shows that the various interconnect tracks 140 to 148 allow individual contacts to be obtained for each of the carrier reservoirs and each of the control gates, while at the same time being compatible with a very reduced etch pitch.

The fabrication method according to the invention thus makes it possible to obtain an electronic component 1 with multiple quantum islands including secondary control gates, with an optimum integration density, while at the same time limiting the amplitude of the stray capacitances.

Figure 39:
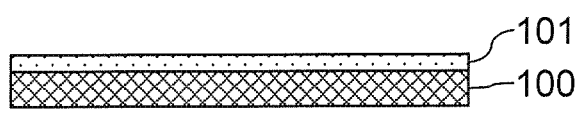
Figure 40:
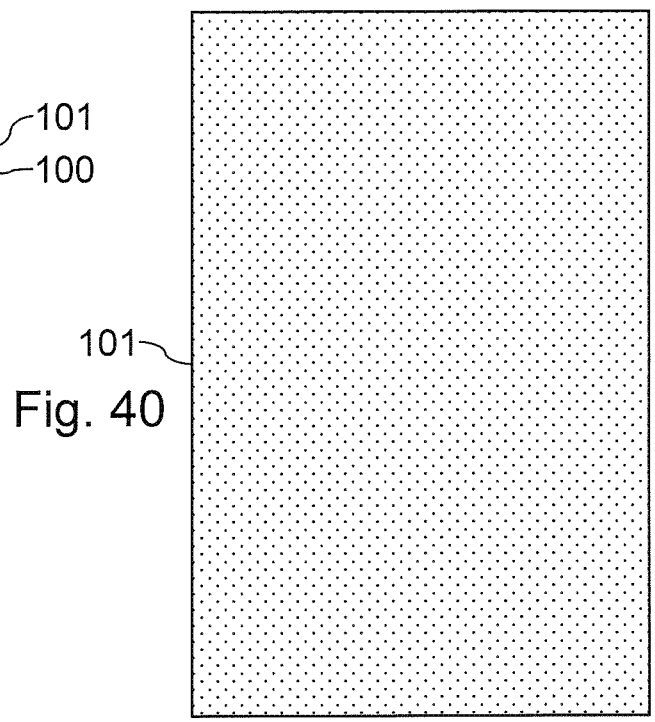

In FIGS. 39 and 40, the step 921 is implemented. Here, a substrate of the silicon-on-insulator type is initially supplied. A layer of silicon 101 (for example of silicon not intentionally doped) is thus disposed on an insulating layer 100 of dielectric, typically of $SiO_2$. The invention is of course also applicable to a bulk substrate or to a substrate having an insulation using a deep trench isolation.

Figure 41:
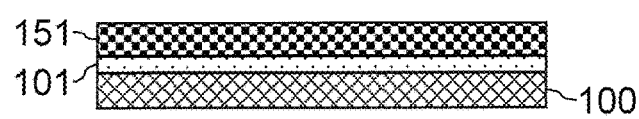
Figure 42:
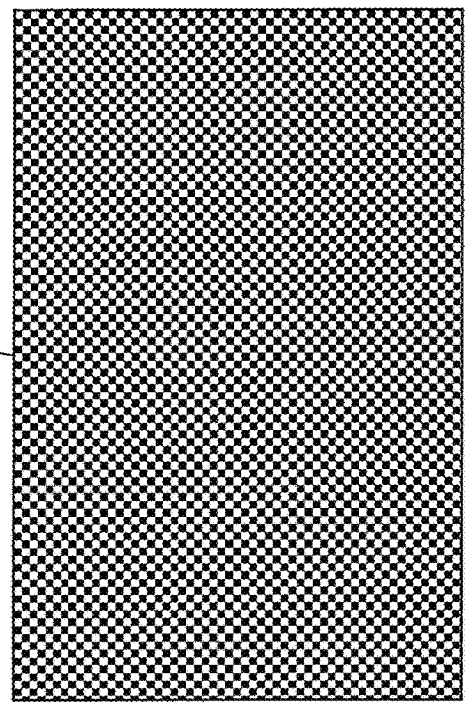

At the step 922, a step for formation of a hard mask 151 is implemented, as illustrated in FIGS. 41 and 42. The hard mask 151 here is for example made of SiN. The hard mask 151 has a thickness adapted as a function of the desired width for carrier injection tracks detailed hereinbelow.

Figure 43:
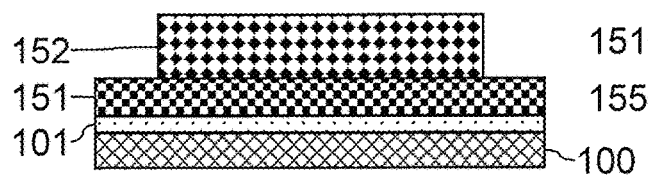
Figure 44:
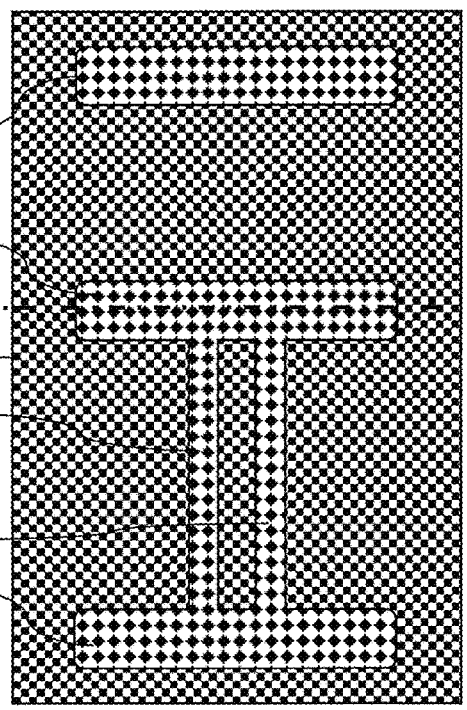

At the step 923, the formation of a mask is implemented for defining active regions and facilitating the suppression of the short-circuiting between the control gates, as illustrated in FIGS. 43 and 44. The mask formed is defined by photolithography. The mask formed notably comprises strips 152, 153 and 154 that are parallel and oriented in a first direction. The strips 152, 153 and 154 here have a width of 80 nm. The mask formed also comprises two strips 155 and 156 spaced out from one another in the first direction. The strips 155 and 156 are spaced out for example by an etch pitch of 90 nm. The strips 155 and 156 run in a second direction, perpendicularly to the strips 152 and 153. The strips 155 and 156 extend from the strip 152 to the strip 153. The strips 155 and 156 here have a width typically in the range between 20 and 30 nm.

Figure 45:
Figure 46:
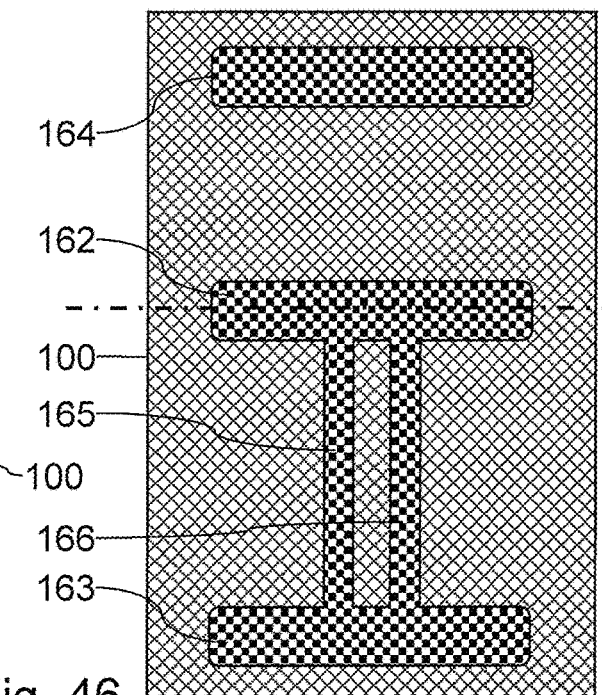

At the step 924, the etch of the layer of silicon 101 and of the hard mask layer 151 are carried out, according to the pattern of the mask defined at the step 923. The layer 101 and the hard mask layer 151 are for example etched according to an anisotropic etch. After etch, the hard mask comprises strips 162, 163 and 164 that are parallel and oriented in the first direction, and corresponding to the patterns of the strips 152, 153 and 154, respectively. The mask formed also comprises two strips 165 and 166 spaced out from one another in the first direction, and corresponding to the patterns of the strips 155 and 156. The strips 165 and 166 extend in the second direction, perpendicularly to the strips 162 and 163. The strips 165 and 166 extend from the strip 162 to the strip 163. Strips 172 to 176 (detailed hereinbelow) are formed in a residual layer of silicon 171, according to the same pattern as the strips 162 to 166, respectively. As illustrated in FIGS. 45 and 46, the mask defined at the step 923 is removed.

Figure 47:
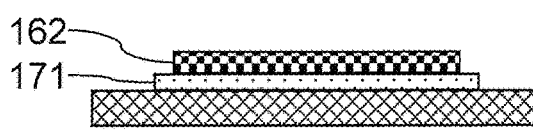
Figure 48:
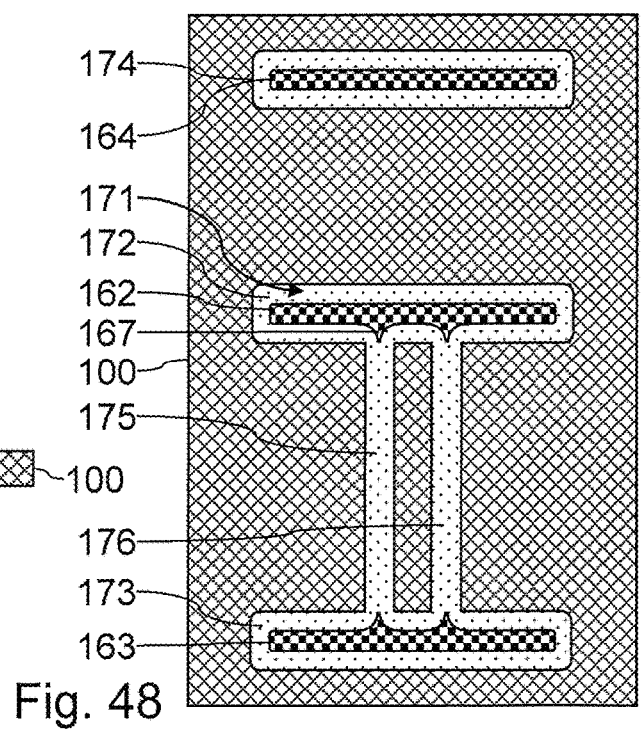

At the step 925, an isotropic etch step is implemented, as illustrated in FIGS. 47 and 48. The isotropic etch step is carried out so as to conserve a part of the strips of hard mask 162, 163 and 164 and so as to uncover a part of the strips of silicon 172, 173 and 174. The strips of hard mask 165 and 166 are removed in order to uncover the strips of silicon 175 and 176. The uncovered strips of silicon 175 and 176 are arranged in one and the same plane passing through the carrier reservoir 173 and the strip 172 forming a nanowire. The strips of silicon 175 and 176 extend in the transverse direction, perpendicular to the longitudinal direction of the strip 172. The etch has removed a width of 20 nm of hard mask from the edges. Such an etch has allowed protrusions 167 of hard mask to be defined facing the strips 175 and 176. These protrusions 167 are pointed and allow the injection of carriers into the qubits to be facilitated, following the fabrication process. The etch step furthermore later on allows a separation between the control gates to be obtained.

The aim of the strip 174 is to allow the suppression of the short-circuit between the upper gates. The aim of the strip 172 is to form a nanowire in which the qubits are formed.

Figure 49:
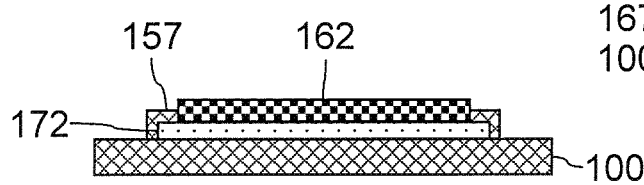
Figure 50:
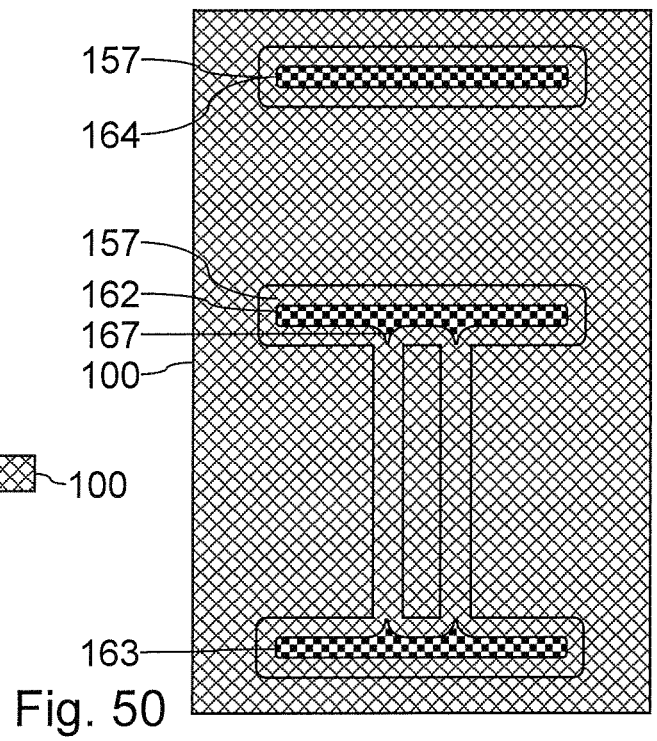

At the step 926, a dielectric layer 157 is formed for encapsulating the strips 172 to 176 of the layer of silicon, as illustrated in FIGS. 49 and 50. The dielectric layer 157 may for example be formed by thermal oxidation of the surface of the strips of silicon, or by deposition of a dielectric layer.

Figure 51:
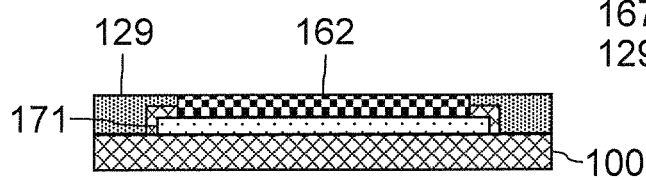
Figure 52:
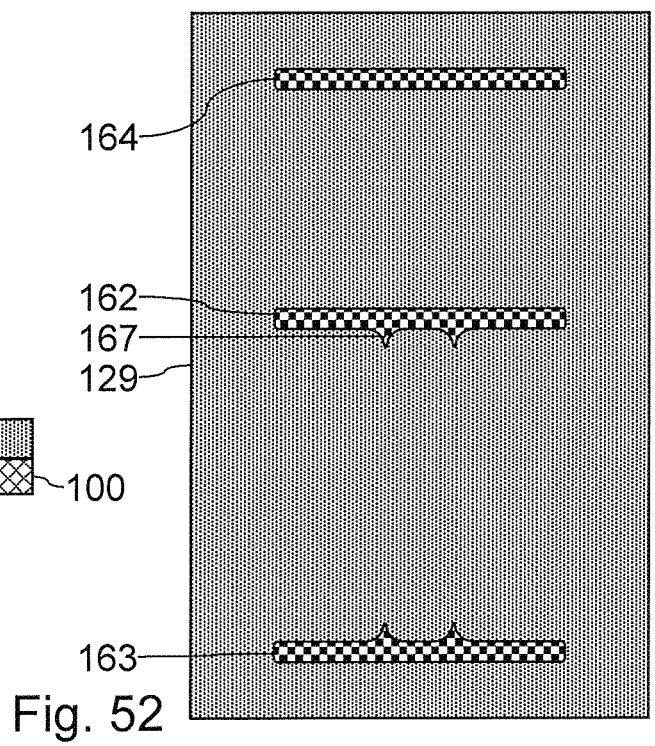

At the step 927, a gate conductor layer 129 is deposited. The layer 129 here is made of doped polysilicon. A planarization step is subsequently implemented with a stop on the hard mask, as illustrated in FIGS. 51 and 52. The planarization is for example implemented by mechanical polishing.

Figure 53:
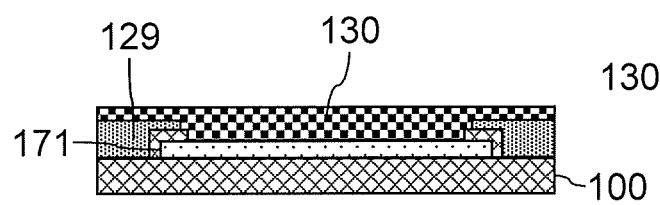
Figure 54:
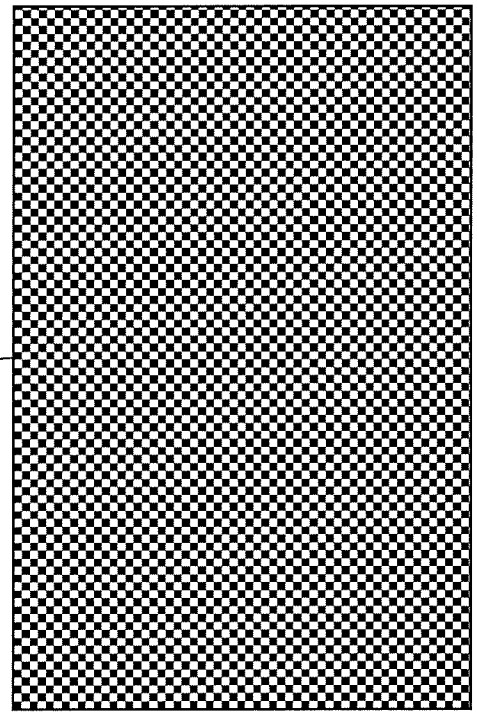

At the step 928, a layer of gate hard mask 130 is formed, as illustrated in FIGS. 53 and 54. The hard mask 130 is for example formed from SiN. The layer 130 deposited may advantageously have a maximum thickness of 10 nm, so as to facilitate suppression of short-circuits and to obtain various types of control gates of the same thickness.

Figure 55:
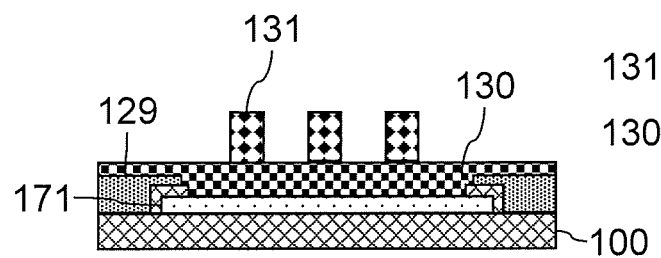
Figure 56:
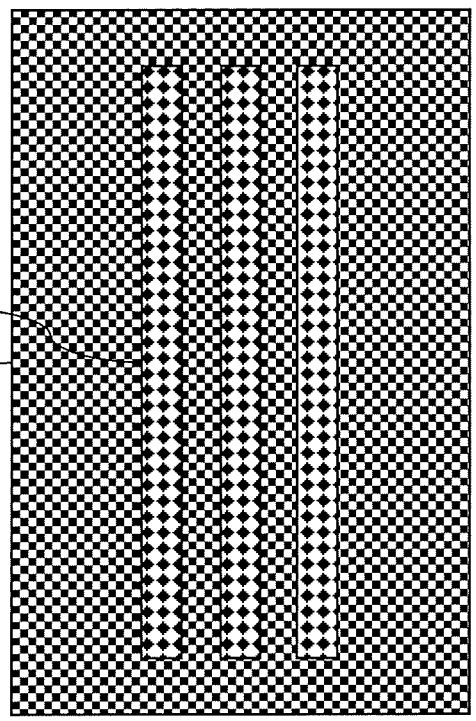

At the step 929, a step for formation of a mask 131 by photolithography is implemented, as illustrated in FIGS. 55 and 56. The mask 131 defines the shapes of interlayer carrier reservoirs. The etch pitch between the interlayer carrier reservoirs in the process of being defined is for example 90 nm, for example by a method of immersion by deep-ultraviolet photolithography.

Figure 57:
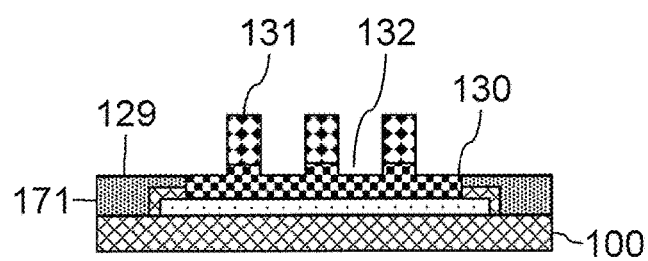
Figure 58:
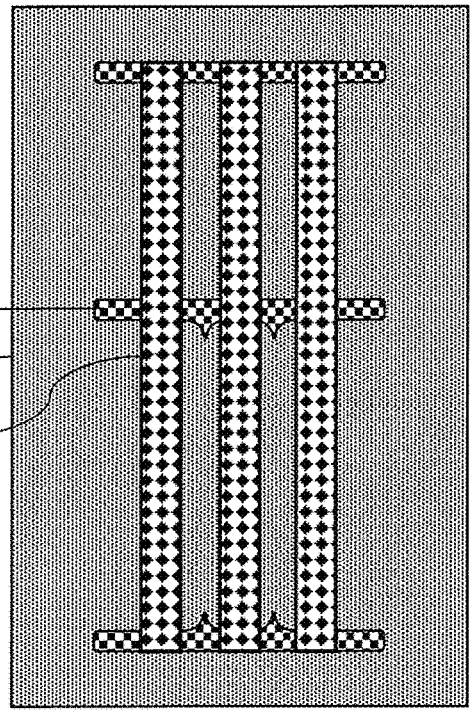

At the step 930, a step for etching the layer 130 is implemented, according to the pattern of the mask 131. The etch is interrupted on the layer of polysilicon 129. The etch here is of the anisotropic type. Grooves 132 are formed between strips of the pattern of the mask 131, as illustrated in FIGS. 57 and 58. A part of the hard mask layer 130 is conserved directly above the layer of silicon 101. In order to facilitate an etch stop in an intermediate part of the hard mask layer 130, a thin layer of another material is advantageously interposed between the hard mask 151 and the hard mask layer 130.

At the step 931, an etch is implemented for definition of the stacks of the main gates, according to the patterns of the mask 131. An anisotropic etch of the layer of polysilicon, of the hard mask layer 130 and of the dielectric layer 157 is implemented so as to uncover the substrate 100 and the residual layer of silicon 171. The residual layer of silicon 17 is notably uncovered at the grooves 132 between the gate stacks 112.

Figure 59:
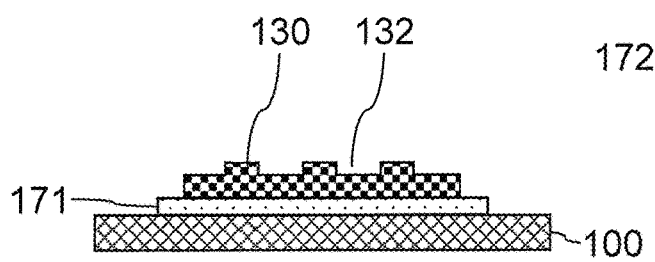
Figure 60:
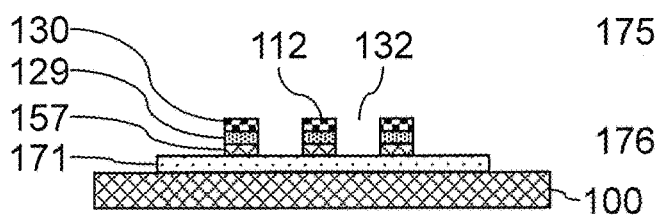
Figure 61:
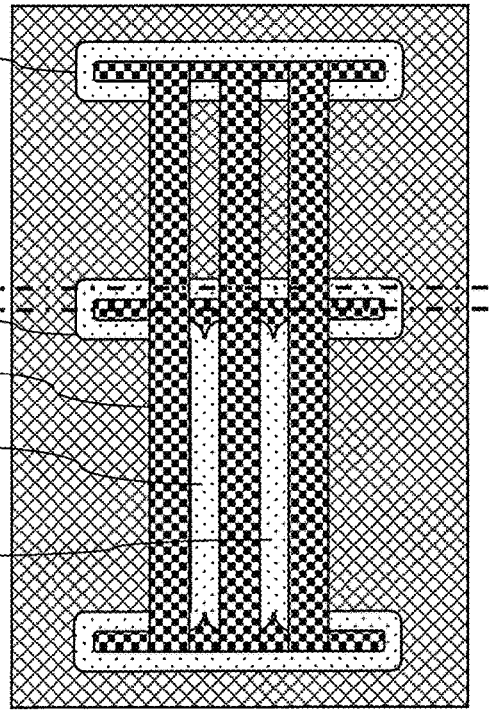

The mask is removed at the end of the step 931, as illustrated in FIGS. 59 to 61. The configuration at the end of this step is illustrated in two different cross-sectional planes, shown with dashed-dotted lines. FIG. 60 is a cross-sectional view of the gate stacks 112. In practice, lower stacks of main gates and upper stacks of main gates are formed on either side of the strip 162 of hard mask. The upper main gates are here for example aimed at the writing of the qubits. The lower main gates are here for example aimed at the reading of the qubits. The strip 162 is thus interposed between the lower main gates and the upper main gates so as to electrically insulate them.

Figure 62:
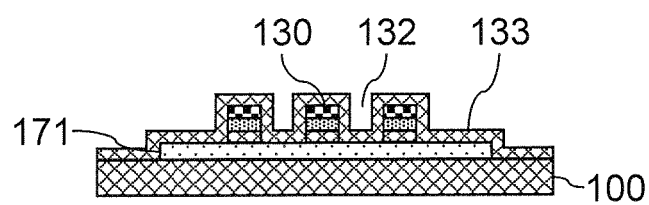
Figure 63:
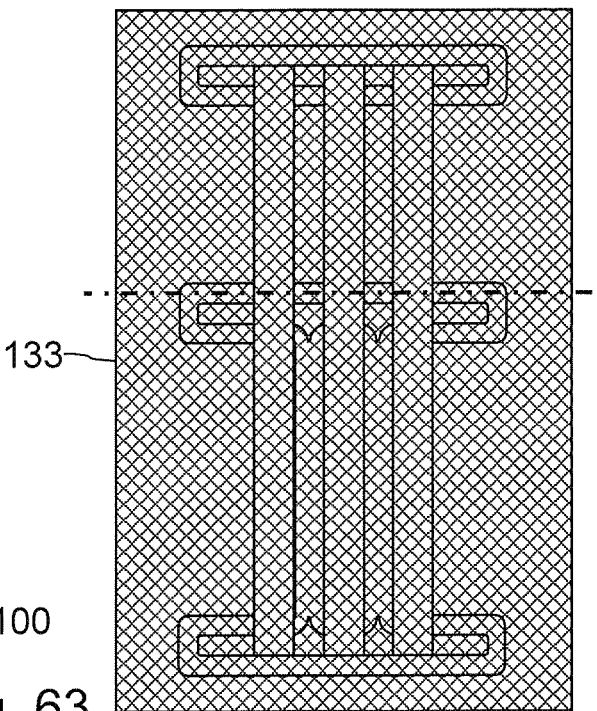

At the step 932, a step for formation of a dielectric layer 133 is implemented, as illustrated in FIGS. 62 and 63. The layer 133 is for example formed by a conformal deposition of $SiO_2$. This dielectric layer 133 is intended, later on, to form an electrical isolation between the main control gates and carrier interlayer conductors. The dielectric layer 133 is notably formed in the bottom and on the side faces of the grooves 132. The thickness of the layer 133 defines the residual width in the grooves 132 and, as a consequence, the width of the carrier interlayer conductors formed later on.

At the step 933, a step for formation of a layer of conductive material or of highly-doped semiconductor material 134 is implemented in order to form field-effect gates. The strip 173 contains impurities (by doping) which can generate free carriers. The interlayer conductors are designed to bring the carriers by field effect close to the input of the quantum dots which define the qubits. A low-temperature conducting layer 134 allows the field-effect gate to be made biasable.

Figure 64:
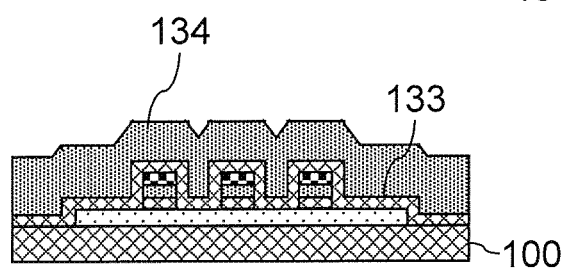
Figure 65:
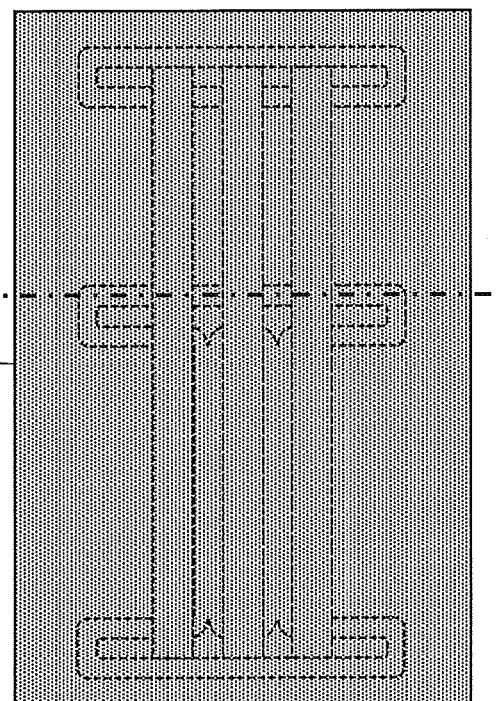

Here, a full-sheet conformal deposition of the layer 134 has been carried out, as illustrated in FIGS. 64 and 65. The layer 134 is for example of doped polysilicon. The layer 134 formed notably fills the grooves 132 between the stacks of the main control gates. The layer 134 extends partially directly above a coupling region of the strip 172.

At the step 934, a partial etch of the layer 134 is carried out. The partial etch is for example an isotropic etch of the layer 134 with a stop on the layer 133. As illustrated in FIGS. 66 and 67, carrier interlayer conductors 120 made of doped polysilicon are formed between the stacks of control gates 112. Spacers 139 made of doped polysilicon are also formed on the side of the end control gate stacks. The thickness of the layer 134 is for example equal to at least half of the space between the main gates (of the level 131). Directly above the strips 175 and 176, i.e. in the lower part with respect to the nanowire 172, the interlayer conductors 120 are separated from these strips of semiconductor material 175 and 176 by the dielectric layer 133. Between the upper main gates, the interlayer conductors 120 are positioned in the same plane as the strips of silicon 175 and 176, the carrier reservoir 173 and the strip 172 forming a nanowire: the dielectric layer 133 under these interlayer conductors of the upper part is formed directly in contact with the substrate 100.

The etch stop on the layer 133 directly above the strips 163 and 164 allows the carrier interlayer conductors 120 to be electrically insulated from one another at their ends. A step for etching the ends of the carrier interlayer conductors 120 could also be envisaged, if the fabrication method does not implement the formation of such strips 163 and 164.

At the step 935, a step for removal of the top face of the layer 133 is implemented, as illustrated in FIGS. 68 and 69. The top face of the gate stacks, of the residual layer of silicon 171 and of the substrate 100 is then uncovered. The layer 133 is conserved between the carrier interlayer conductors 120 and the gate stacks 112. The removal of the top face of the layer 133 is for example implemented by an isotropic etch.

Figure 70:
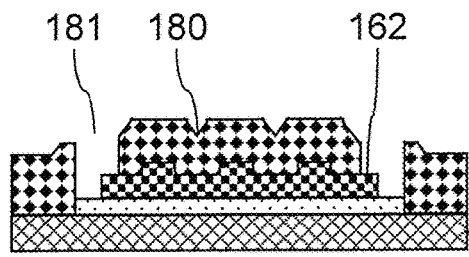
Figure 71:
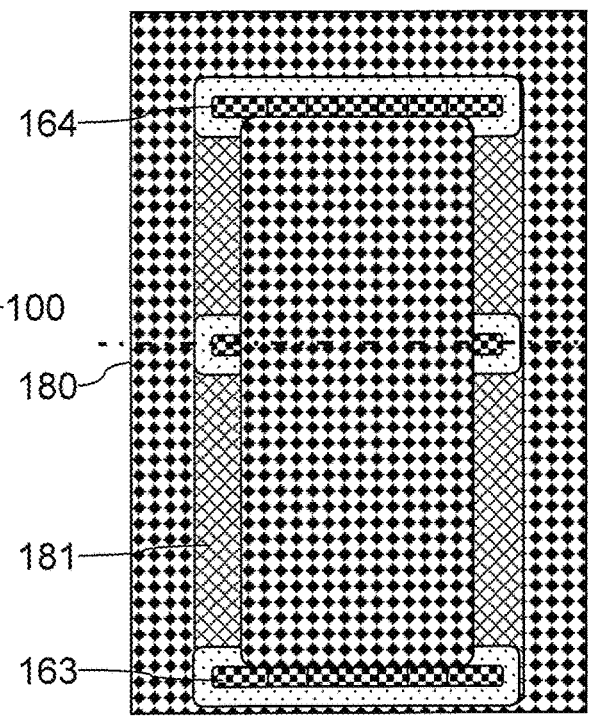

At the step 936, a mask 180 is formed comprising openings 181, as illustrated in FIGS. 70 and 71. The openings 181 notably uncover the strips 163 and 163 and 164, together with the ends of the strip 162 of hard mask. The mask 180 is for example formed by photolithography.

Figure 72:
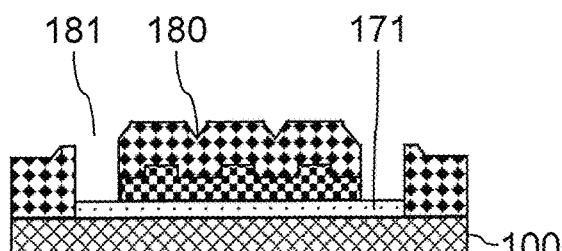
Figure 73:
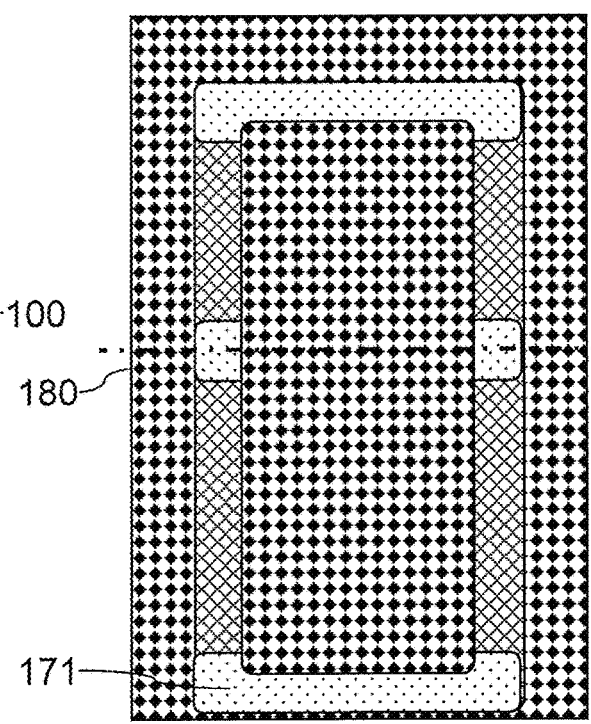

At the step 937, a removal of the hard mask appearing in the openings 181 is implemented, as illustrated in FIGS. 72 and 73. The strips 163 and 164, together with the longitudinal ends of the strip 162, are thus removed. This removal is for example carried out by an anisotropic etch. The residual layer of silicon 171 on the strips 173 and 174, and at the longitudinal ends of the strip 172, are thus uncovered.

Figure 74:
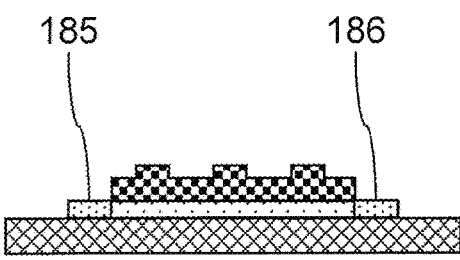
Figure 75:
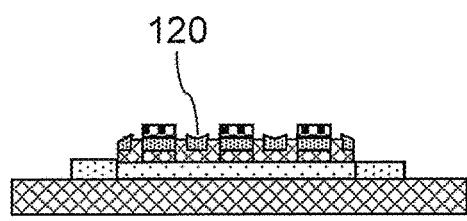
Figure 76:
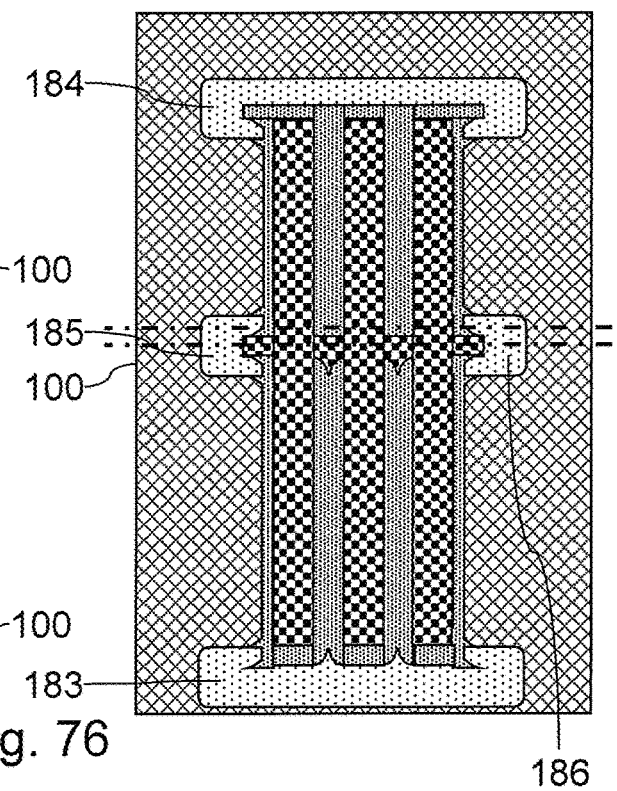

At the step 938, a self-aligned doping in the residual layer of silicon 171 is implemented, in the opening 181, as illustrated in FIGS. 74 to 76. Carrier reservoirs 185 and 186 are thus formed at the longitudinal ends of the strip 172. Carrier reservoirs 183 and 184 are also formed in the strips 173 and 174, respectively. The mask 180 is removed following the doping step.

Figure 77:
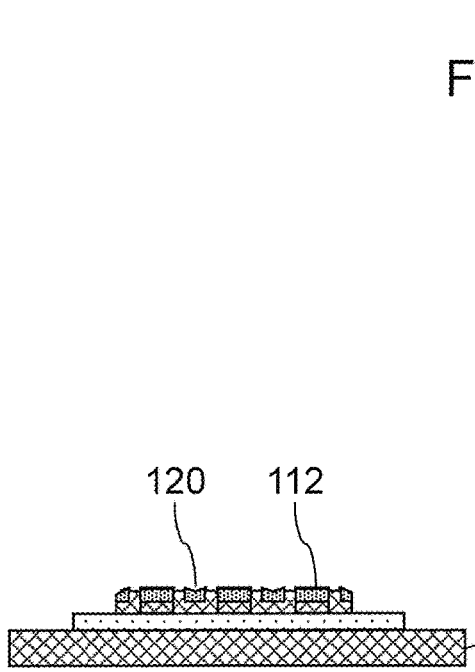
Figure 78:
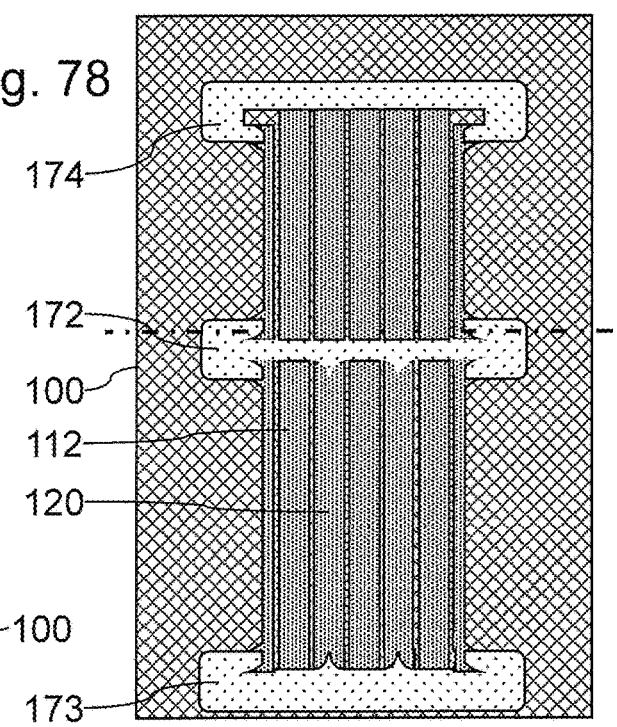

At the step 939, a step for removal of the hard mask layer 130 is implemented, as illustrated in FIGS. 77 and 78. The layer 129 of the stacks 112 is notably uncovered, together with the carrier interlayer conductors 120.

At the step 940, a passivation layer 187 is formed, for example of SiN. The passivation layer 187 is covered with an encapsulation layer 188, for example of $SiO_2$.

Figure 79:
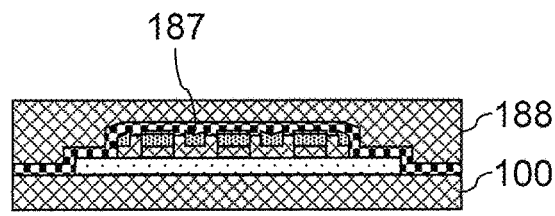

The layer 188 is subsequently subjected to a planarization, for example by a mechanical polishing step. The configuration illustrated in FIG. 79 is then obtained.

Figure 80:
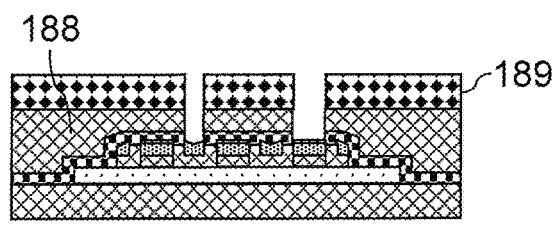

At the step 941, a mask 189 is formed on the layer 188, for example by photolithography. The mask 189 forms openings either directly above carrier conductors 120 or directly above control gates 112. The layer 188 and the layer 187 are then etched according to the pattern of the layer 189. Respective accesses to the various carrier conductors 120 or to the control gates 112, or to the carrier reservoirs 183 to 186 are thus made available. The configuration illustrated in FIG. 80 is then obtained.

At the step 942, vias 190 are formed in a manner known per se through the layer 188, in the accesses previously formed. Each of the control gates 112, each of the carrier conductors 120 and each of the carrier reservoirs 183 to 186 thus has a respective via for electrical connection.

The carrier reservoir 183 can supply carriers by tunnel effect to the carrier conductors 120. Since these carrier conductors 120 extend down to the strip 172, they each allow carriers to be brought to respective qubits formed in this strip 172. Carriers may thus readily be provided even for qubits in a middle part of the strip 172, and separated from the carrier reservoirs 185 and 186 by other qubits. Such a configuration is furthermore obtained here without affecting the integration density, and while limiting the appearance of stray capacitances.

An electronic component 1 with multiple quantum islands with carrier reservoirs allowing carriers to be injected as near as possible to the qubits is obtained. This aspect of the invention proves to be particularly advantageous when at least three qubits are spaced out from one another along a nanowire. Indeed, it is thus possible to readily inject carriers even for qubits far from carrier reservoirs disposed at the ends of this nanowire.

The method of fabrication of an electronic component 1 with multiple quantum islands described with reference to FIGS. 1 to 38 is aimed at forming secondary gates interposed between the main control gates. It may however also be envisaged to use such a method for forming carrier conductors interposed between the main control gates. For this purpose, it may be envisaged to form a contact by tunnel effect between an element made of conductive material 122 and a carrier reservoir that is offset with respect to the nanowire 111. It may for example be envisaged to form an element 122 directly above a carrier reservoir, and separated from this carrier reservoir by a thin dielectric layer, for example with a thickness of 10 nm of dielectric.

The injection of carriers for qubits far from the carrier reservoirs 115 and 116 can thus be enhanced without affecting the integration density and without producing excessive stray capacitances. Control gates 112 and elements 120 may notably be formed each having a length (dimension taken in the longitudinal direction of the strip 172) in the range between 30 and 50 nm, for example of 40 nm.

Figure 82:
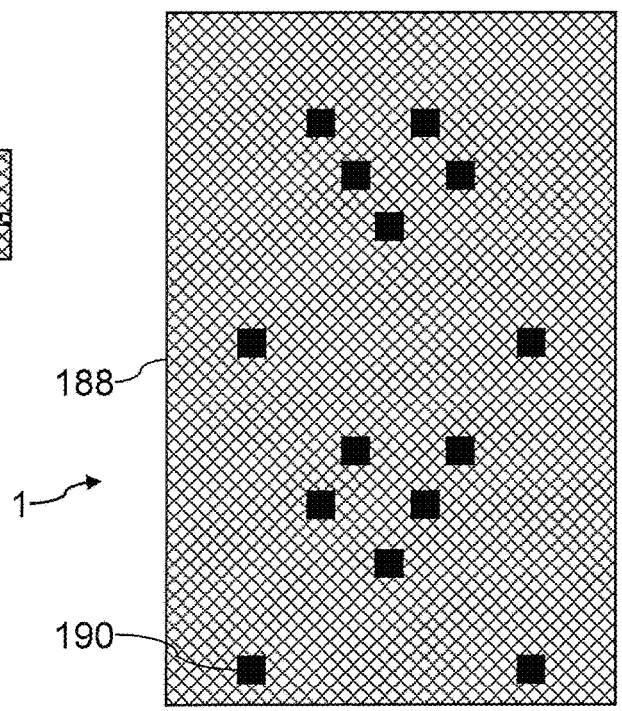
Figure 83:
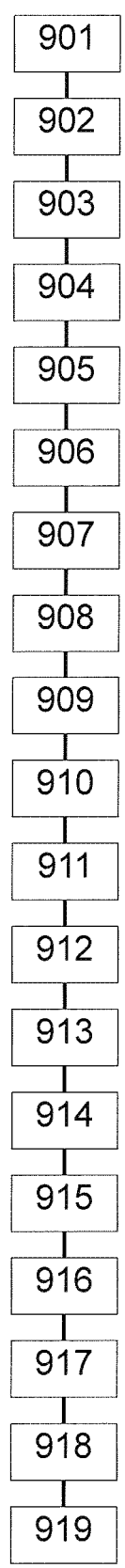
FIG. 83 is a diagram showing the steps implemented in the embodiment of the method illustrated in FIGS. 1 to 38.
Figure 84:
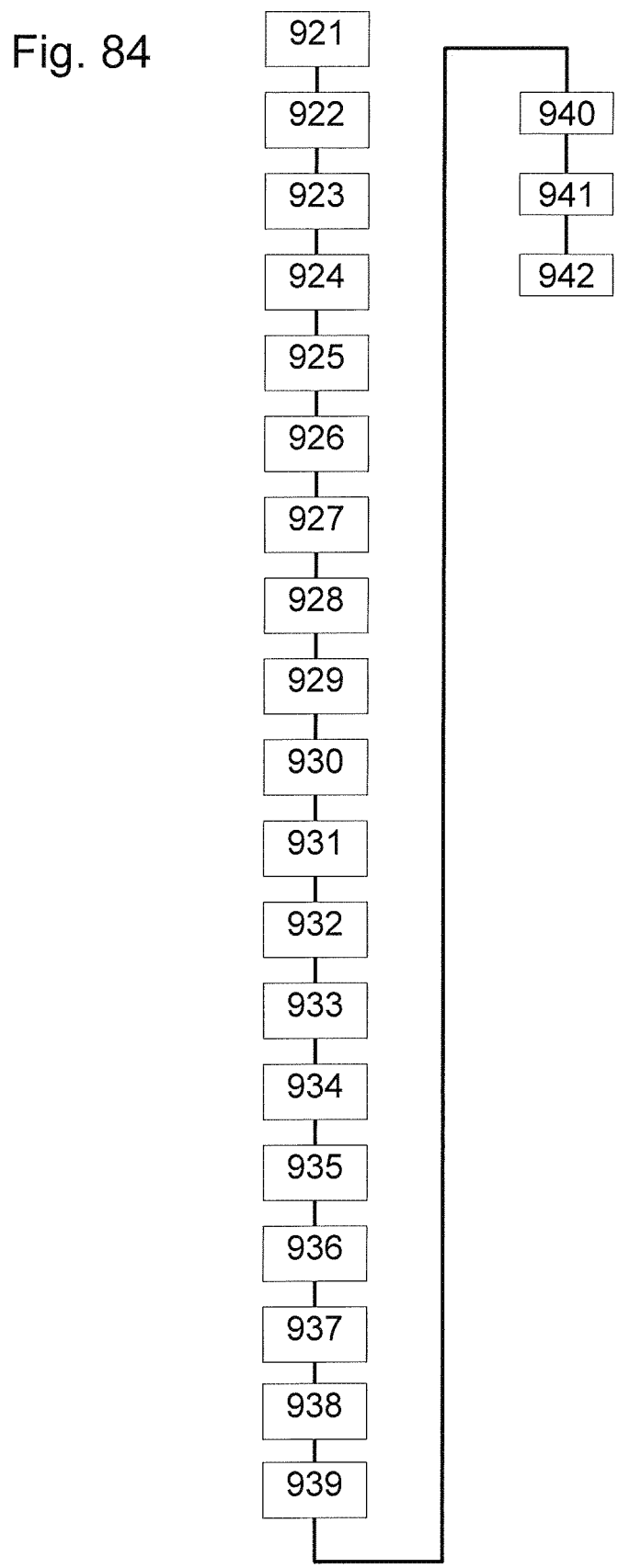
FIG. 84 is a diagram showing the steps implemented in the embodiment of the method illustrated in FIGS. 39 to 82.

It can be observed in FIG. 82 of this example that each of the carrier reservoirs and each of the control gates can have a dedicated contact.

Figure 85:
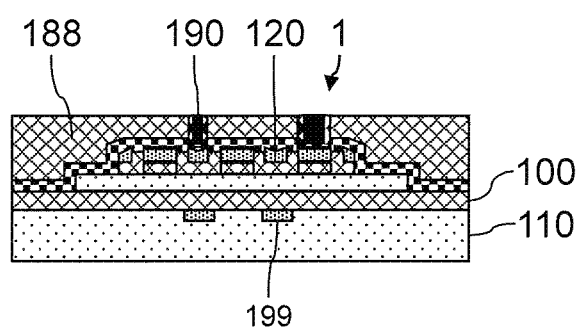
FIG. 85 illustrates a cross-sectional view of a variant applied to the second aspect of the invention.

For the various aspects of the invention, using a substrate 100 of the silicon-on-insulator type, a rear gate is advantageously formed under the insulating layer of the substrate, directly above a coupling region of the nanowire or of the semiconductor element used for the formation of the qubits. FIG. 85 illustrates a configuration in which rear control gates 199 are formed directly above the elements made of conductive materials 120 and a coupling region of the strip of semiconductor material 172. The rear control gates are formed by doping in a layer of semiconductor material (typically of the non-intentionally doped type) 110. The layer of semiconductor material 110 is disposed under a layer of insulator 100. The layer of insulator 100 advantageously has a thickness in the range between 10 and 50 nm. A rear gate 199 is for example formed by doping of the semiconductor under this layer of insulator 100, with a doping advantageously equal to at least $10^{19}$ cm$^3$. The doping of the rear gates 199 may for example be carried out by ion implantation, for example prior to a step for deposition of a layer of semiconductor 101 on the layer of insulator 100.

Since the communication between two adjacent qubits is ensured by the coupling region between them, a rear control gate 199 allows the quantum coupling between the confinement regions of the qubits to be adjusted. The rear gate 199 notably allows the degree of coupling between the two adjacent qubits to be varied via the adjustment of the tunnel barrier separating them. Depending on the polarity applied to the rear gate 199, the tunnel barrier may be reduced (strong coupling) or increased (weak coupling, high confinement) with a minimal coupling with respect to the other tunnel junctions or to the main control gates of the qubits.

The rear control gate 199 is advantageously connected to a control circuit (not shown) configured for applying an electrical bias to the latter.

The variant illustrated in FIG. 85 is shown here in its application to the second aspect of the invention. It may however also be envisaged to apply it to the first aspect of the invention, by disposing rear control gates directly above the secondary control gates.

A control circuit is advantageously configured to apply suitable potentials:
to one or more main control gates so as to write their respective qubits;
to one or more main control gates so as to read their respective qubits;
to one or more rear control gates so as to adjust the degree of coupling between two respective adjacent qubits;
to one or more secondary gates, so as to adjust the degree of coupling between two respective adjacent qubits;
to one or more interlayer conductors, so as to bring carriers by field effect close to the input of the quantum dots which define the qubits.

The invention claimed is:

1. An electronic component with multiple quantum islands, comprising:
a substrate on which rests a nanowire made of semiconductor material not intentionally doped and extending in a longitudinal direction;
two main control gates resting on the nanowire so as to form respective qubits in the nanowire under the two main control gates, the two main control gates extending in a transverse direction perpendicular to the longitudinal direction, the two main control gates being separated by a groove positioned directly above the nanowire, and bottom and lateral faces of the groove being covered by a dielectric layer;
an element made of conductive material formed on the dielectric layer in the groove; and
a carrier reservoir that is offset with respect to the nanowire, the element made of the conductive material being separated from the carrier reservoir by another dielectric layer such that the element made of the conductive material is connected to the carrier reservoir by field effect.

2. The electronic component with multiple quantum islands according to claim 1, wherein the two main control gates are offset with respect to one another in the longitudinal direction of the nanowire with a pitch of between 60 nm and 120 nm.

3. The electronic component with multiple quantum islands according to claim 1, wherein the element made of the conductive material has a part that is arranged directly above the carrier reservoir.

4. The electronic component with multiple quantum islands according to claim 3, further comprising a strip of semiconductor material that is arranged in a same plane passing through the carrier reservoir and the nanowire, the strip of semiconductor material extending in a direction that is transverse to the vertical of the element made of the conductive material and being separated from the element made of the conductive material by the dielectric layer.

5. The electronic component with multiple quantum islands according to claim 4, the element made of the conductive material being positioned on a first side of the nanowire, the electronic component further comprising another element made of conductive material that is positioned in alignment with the element made of the conductive material and extending perpendicularly to the nanowire on a second side thereof, the another element made of the conductive material being arranged in the same plane passing through the strip of the semiconductor material.

6. The electronic component with multiple quantum islands according to claim 5, further comprising a dielectric strip resting on a central part of the nanowire and interposed between the two main control gates extending from the first side of the nanowire and the two other main control gates extending from the second side of the nanowire, wherein the dielectric strip includes a protrusion extending in a direction that is transverse to the nanowire, in alignment with the element made of the conductive material.

7. The electronic component with multiple quantum islands according to claim 1, further comprising two other carrier reservoirs in contact with respective ends of the nanowire.

8. The electronic component with multiple quantum islands according to claim 1, wherein the element made of the conductive material is made of polysilicon with a doping concentration of between $10^{18}$ cm$^{-3}$ and $5*10^{20}$ cm$^{-3}$.

9. The electronic component with multiple quantum islands according to claim 1, wherein the two main control gates extend perpendicularly to the nanowire on a first side thereof, the electronic component further comprising two other main control gates extending perpendicularly to the nanowire on a second side thereof.

10. The electronic component with multiple quantum islands according to claim 9, further comprising a control circuit configured to apply write potentials of respective qubits to the two main control gates extending on the first side of the nanowire and to apply read potentials of respective qubits to the two other main control gates extending on the second side of the nanowire.

11. The electronic component with multiple quantum islands according to claim 9, further comprising a dielectric strip resting on a central part of the nanowire and interposed between the two main control gates extending from the first side of the nanowire and the two other main control gates extending from the second side of the nanowire.

12. The electronic component with multiple quantum islands according to claim 1, wherein the two main control gates are positioned between two other main control gates resting on the nanowire so as to form two other respective qubits in the nanowire under the two other main control gates.

13. The electronic component with multiple quantum islands according to claim 1, wherein a top of the element made of the conductive material is lower than a top of the two main control gates.

14. The electronic component with multiple quantum islands according to claim 1, wherein the dielectric layer separating the element made of the conductive material with respect to the two main control gates has a thickness of between 2 urn and 8 nm.

15. The electronic component with multiple quantum islands according to claim 1, wherein the element made of the conductive material is free from superposition on the two main control gates.

16. The electronic component with multiple quantum islands according to claim 1, wherein the substrate is of silicon-on-insulator type and includes a buried insulating layer separating the nanowire from a part of the substrate made of semiconductor material, the semiconductor material under the said buried insulating layer being doped directly above the groove.

17. The electronic component with multiple quantum islands according to claim 1, wherein the substrate includes an insulating layer on which the nanowire is arranged, the substrate further including a layer of semiconductor material formed under the insulating layer, a part of the layer of semiconductor material that is positioned directly above the element made of the conductive material being doped.

18. The electronic component with multiple quantum islands according to claim 17, further comprising a control circuit that is configured to apply a potential to the doped part of the layer of semiconductor material, so as to control a coupling between two qubits of the nanowire.

19. The electronic component with multiple quantum islands according to claim 1, wherein the carrier reservoir is offset with respect to the nanowire in the transverse direction.

20. The electronic component with multiple quantum islands according to claim 1, further comprising a control circuit that is configured to apply a potential to the element made of the conductive material so as to control a coupling between two qubits of the nanowire.

21. A method of fabricating an electronic component with multiple quantum islands as recited in claim 1, comprising:
 supplying the substrate on which rests the nanowire made of semiconductor material not intentionally doped and extending in the longitudinal direction, the nanowire having at least two main control gates resting on the nanowire so as to form respective qubits in the nanowire under the two main control gates, the two main control gates extending in the transverse direction perpendicular to the longitudinal direction, the two main control gates being separated by the groove positioned directly above the nanowire, and top and lateral faces of the two main control gates and the bottom of the groove being covered by the dielectric layer;
 depositing the conductive material in the groove on the dielectric layer to form the element; and
 forming the connection by field effect between the conductive material and the carrier reservoir via the another dielectric layer.

22. The method of fabricating an electronic component with multiple quantum islands according to claim 21, further comprising planarizing the conductive material after the depositing, so as to obtain the element made of the conductive material that is self-aligned between the two main control gates.

\* \* \* \* \*